US009758867B2

(12) United States Patent
Nakajima et al.

(10) Patent No.: US 9,758,867 B2
(45) Date of Patent: Sep. 12, 2017

(54) METHOD OF CONTROLLING GAS SUPPLY APPARATUS AND SUBSTRATE PROCESSING SYSTEM

(71) Applicant: TOKYO ELECTRON LIMITED, Tokyo (JP)

(72) Inventors: Shigeru Nakajima, Nirasaki (JP); Hiromi Shima, Nirasaki (JP); Yusuke Tachino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/227,754

(22) Filed: Mar. 27, 2014

(65) Prior Publication Data

US 2014/0290577 A1 Oct. 2, 2014

(30) Foreign Application Priority Data

Mar. 28, 2013 (JP) .................. 2013-069973

(51) Int. Cl.
*C23C 16/448* (2006.01)
*C23C 16/44* (2006.01)
*C23C 16/52* (2006.01)

(52) U.S. Cl.
CPC ...... *C23C 16/4481* (2013.01); *C23C 16/4401* (2013.01); *C23C 16/4408* (2013.01); *C23C 16/52* (2013.01)

(58) Field of Classification Search
None
See application file for complete search history.

(56) References Cited

U.S. PATENT DOCUMENTS

| 4,844,006 A * | 7/1989 | Page, Jr. ............. | C23C 16/4481 118/715 |
| 2003/0072875 A1* | 4/2003 | Sandhu ............... | C23C 16/4481 427/248.1 |
| 2006/0144338 A1* | 7/2006 | Liu et al. ...................... | 118/726 |
| 2007/0248515 A1* | 10/2007 | Tompa ................. | C23C 16/407 423/179 |
| 2009/0035465 A1* | 2/2009 | Marsh et al. ............ | 427/255.28 |

FOREIGN PATENT DOCUMENTS

| CN | 102102195 A | 6/2011 |
| JP | 05-291144 A | 11/1993 |
| JP | 6-349743 A | 12/1994 |

(Continued)

*Primary Examiner* — Joseph Miller, Jr.
(74) *Attorney, Agent, or Firm* — Nath, Goldberg & Meyer; Jerald L. Meyer

(57) ABSTRACT

Provided is a method of controlling a gas supply apparatus including a vaporizer, a carrier gas supply source and a gas supply line, the method including: supplying a liquid or sold raw material to a raw material container included in a vaporizer; vaporizing the liquid or sold raw material in the raw material container to produce a raw material gas; exhausting an interior of the raw material container having the liquid or sold raw material; supplying a carrier gas from the carrier gas supply source to the raw material container; and flowing the raw material gas and the carrier gas from the raw material container to a processing chamber in which a substrate to be processed is accommodated via the gas supply line.

8 Claims, 21 Drawing Sheets

(56) References Cited

FOREIGN PATENT DOCUMENTS

| | | | |
|---|---|---|---|
| JP | 2000-306907 | A | 11/2000 |
| JP | 2001-32073 | A | 2/2001 |
| JP | 2002-69651 | A | 3/2002 |
| JP | 2002-525430 | A | 8/2002 |
| JP | 2010-034511 | A | 2/2010 |
| JP | 2012-062502 | A | 3/2012 |
| JP | 2012-172171 | A | 9/2012 |
| TW | 200425220 | A | 1/2004 |

\* cited by examiner

First Reference Example

First Reference Example

First Reference Example

First Reference Example

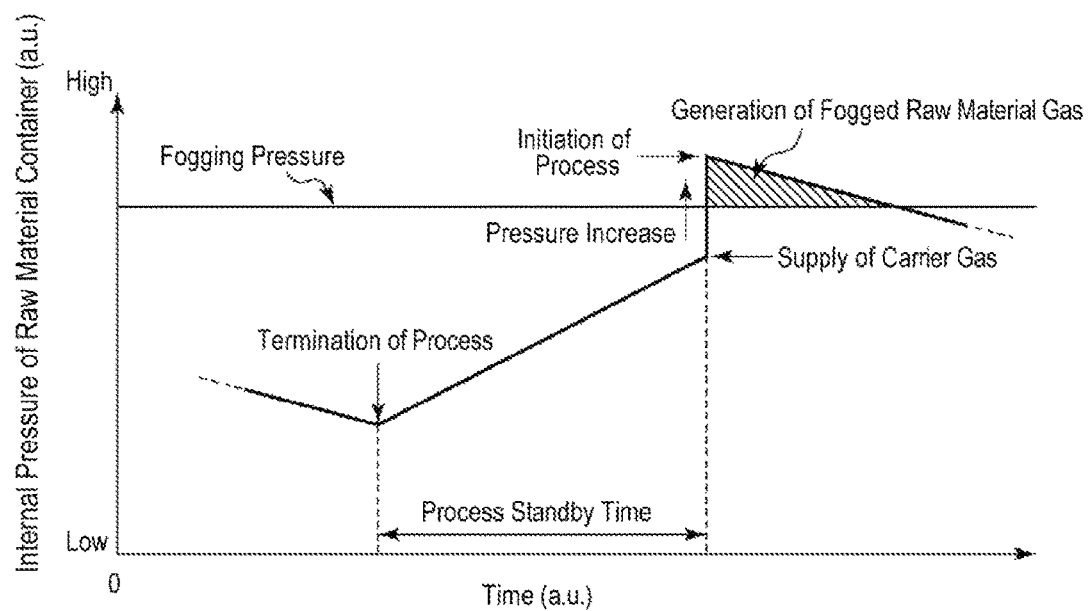

First Embodiment

First Embodiment: Modified Example

Second Reference Example

Second Reference Example

Second Reference Example

Second Reference Example

Second Embodiment

Second Embodiment

Second Embodiment

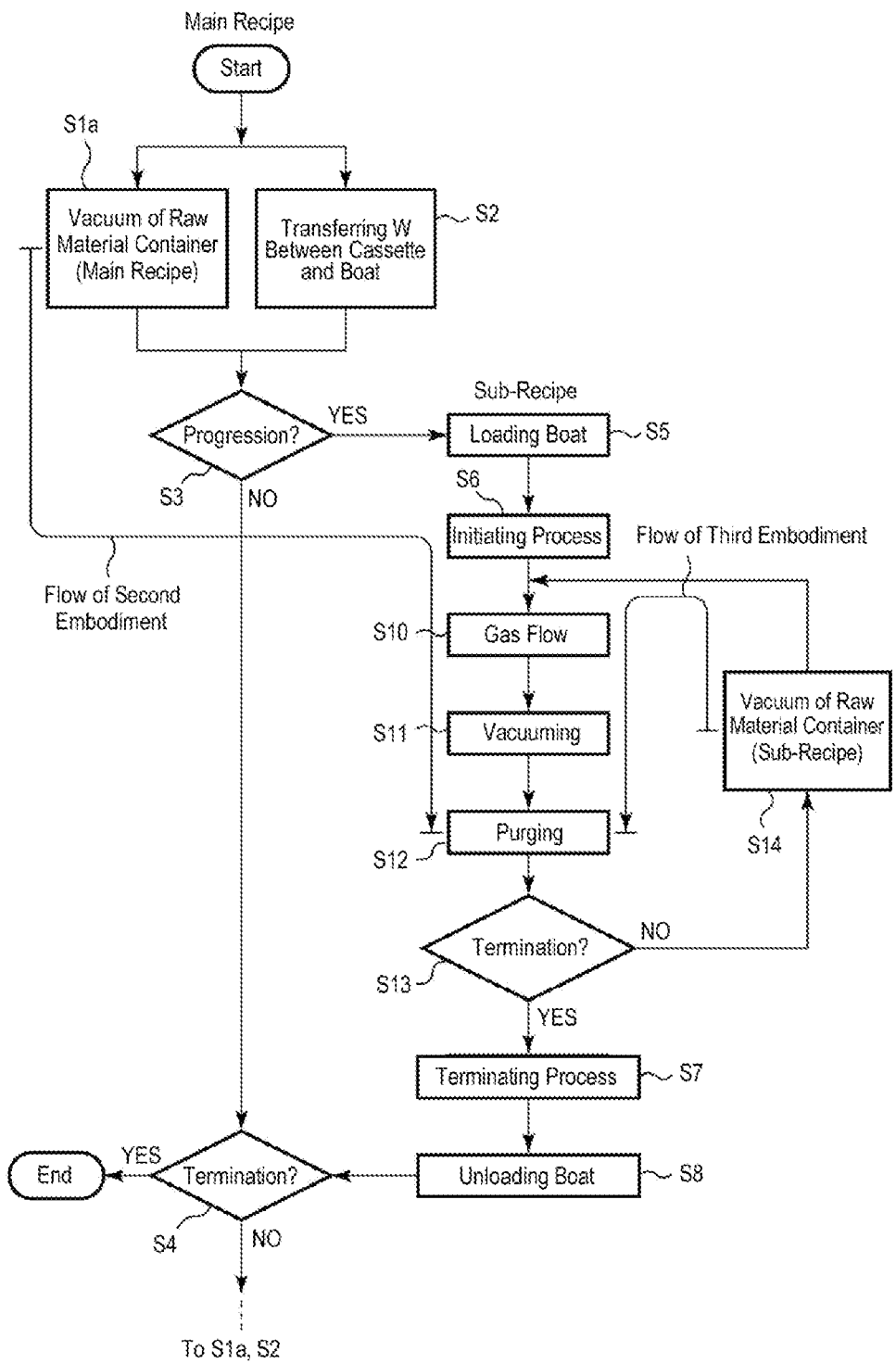

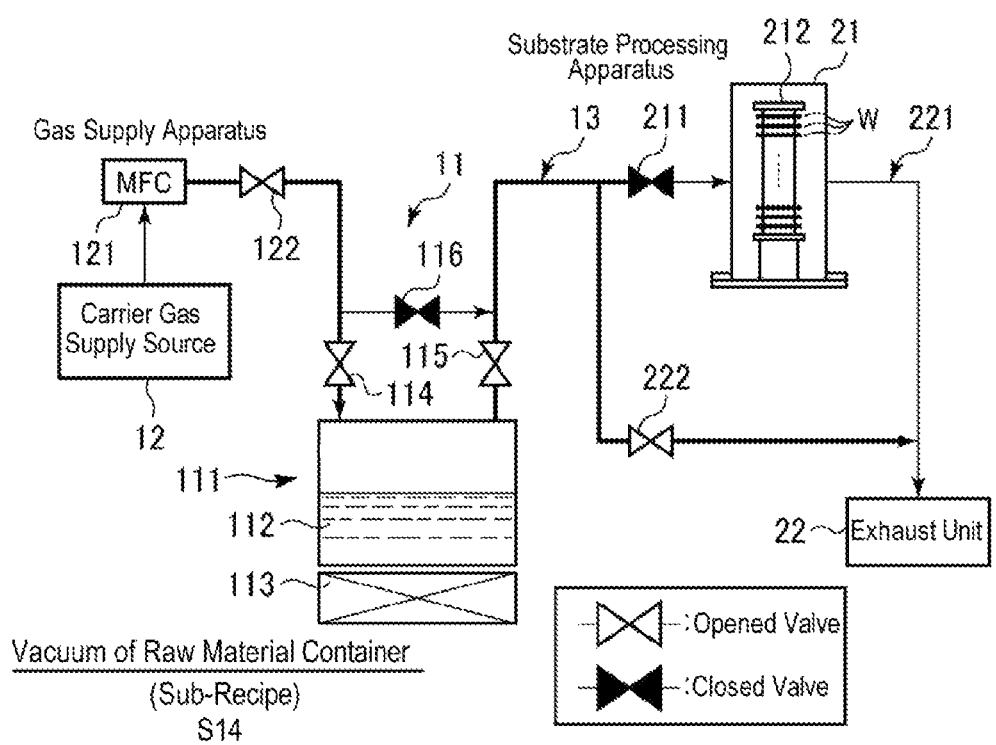

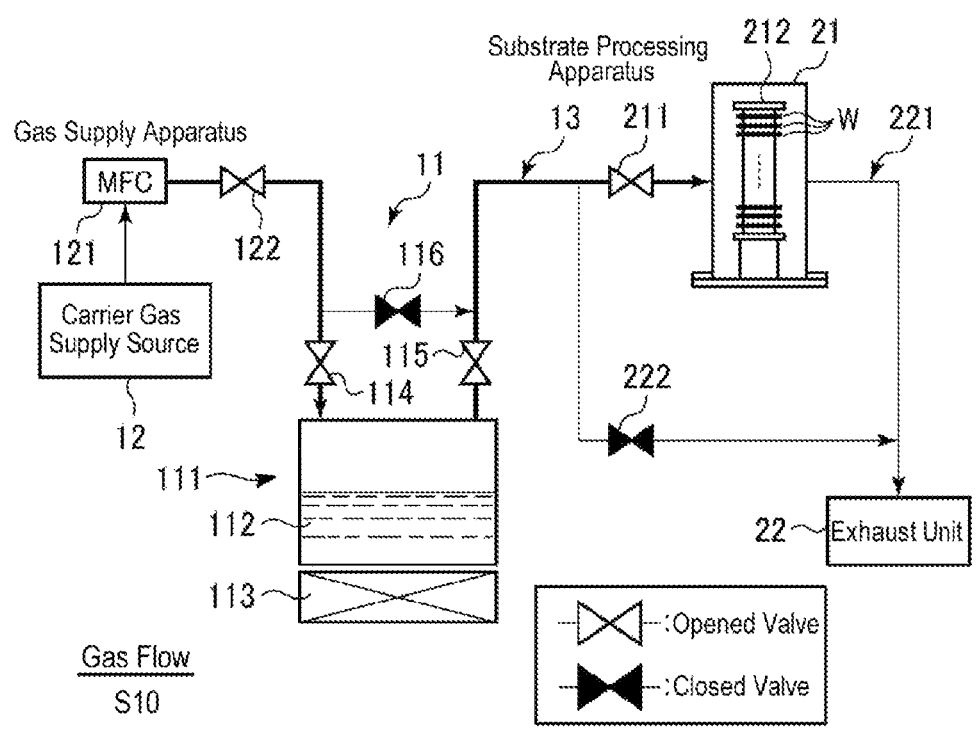

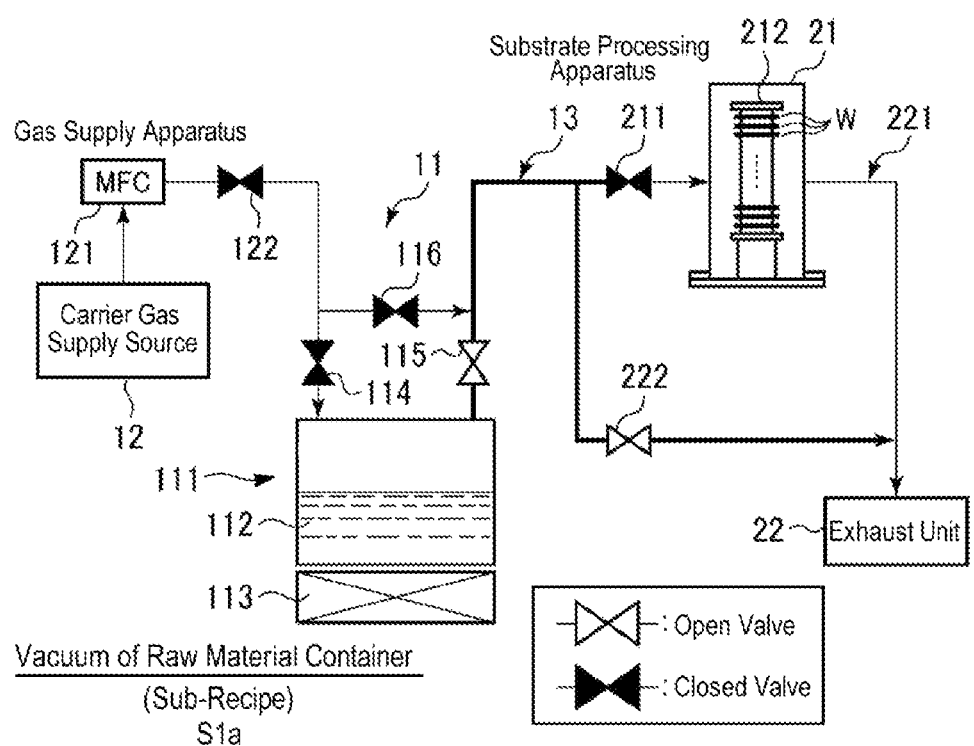

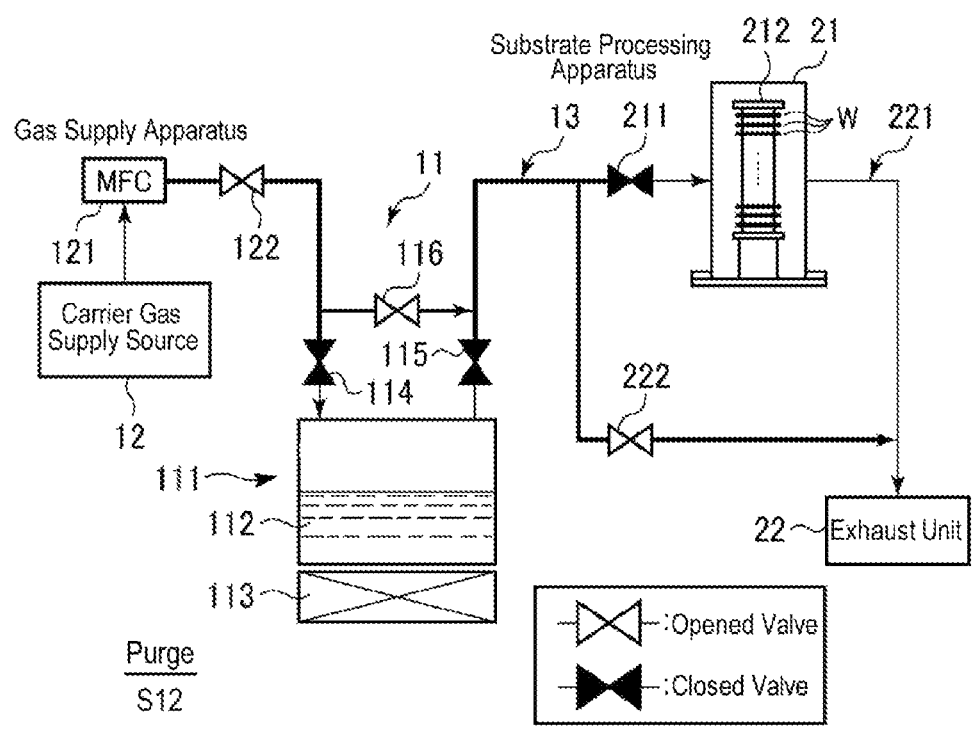

METHOD OF CONTROLLING GAS SUPPLY APPARATUS AND SUBSTRATE PROCESSING SYSTEM

CROSS-REFERENCE TO RELATED APPLICATION

This application claims the benefit of Japanese Patent Application No. 2013-069973, filed on Mar. 28, 2013, in the Japan Patent Office, the disclosure of which is incorporated herein in its entirety by reference.

TECHNICAL FIELD

The present disclosure relates to a method of controlling a gas supply apparatus and a substrate processing system.

BACKGROUND

In a process for manufacturing an electronic product such as a Large Scale Integration (LSI), a process of forming a thin film is performed. As a method of forming the thin film, a film forming method based on a dry (gas phase) processing is widely used. Such a dry processing includes supplying a raw material gas used to form a thin film into a processing chamber of a substrate processing system, and forming the thin film on a substrate to be processed (e.g., silicon wafer) loaded into the processing chamber.

A raw material of the thin film is classified into two types: one is in a gaseous state in room temperature, and the other is in a liquid or solid state in room temperature. The gas raw material in the gaseous state may be directly supplied into the processing chamber as a raw material gas. However, the liquid or solid raw material should be vaporized before being supplied into the processing chamber. In this case, a gas supply apparatus is required to include an additional vaporizer which vaporizes the liquid or solid raw material into the raw material gas.

In such gas supply apparatus, a liquid or solid raw material is received and vaporized in a raw material container. The raw material container functions as the vaporizer. The raw material vaporized inside the raw material container, which is hereinafter referred to as the "raw material gas," is provided to a gas supply line together with a carrier gas supplied into the raw material container. The raw material gas and the carrier gas are transferred through the gas supply line to be supplied to the processing chamber.

Thereafter, a film forming processing is performed inside the processing chamber. In this case, a supply amount of the raw material gas supplied into the processing chamber is controlled based on the amount of the raw material gas per unit time vaporized inside the raw material container and a flow rate of the carrier gas supplied into the raw material container. Controlling the supply amount of the raw material gas is one of important factors for optimizing, e.g., for forming the thin film to have a uniform thickness, a film forming rate of the thin film or the like, for each process.

The amount of the raw material gas per unit time is mainly controlled by increasing or decreasing a heating temperature of the raw material container (temperature control). The flow rate of the carrier gas is controlled using a mass flow controller (flow rate control).

However, when optimizing the supply amount of the raw material gas for each process, if the flow rate of the carrier gas is increased, it has been confirmed that the particles generated inside the processing chamber tend to increase in the film forming process, for example. This may cause the particles to be attached to the formed thin film or be introduced in the formed thin film, which results in deterioration in quality of the formed thin film.

SUMMARY

Some embodiments of the present disclosure provide a method of controlling a gas supply apparatus, and a substrate processing system equipped with the gas supply apparatus for performing the method, which vaporize a liquid or solid raw material using a vaporizer to produce a raw material gas, thus preventing particles from being increased even if a flow rate of a carrier gas supplied into the vaporizer is increased.

Further, some embodiments of the present disclosure provide a method of controlling a gas supply apparatus, and a substrate processing system equipped with the gas supply apparatus for performing the method, which are capable of forming a thin film having a thin thickness on a substrate to be processed while preventing a fluctuation in film thickness.

According to one embodiment of the present disclosure, provided is a method of controlling a gas supply apparatus including a vaporizer, a carrier gas supply source and a gas supply line, the method including: supplying a liquid or sold raw material to a raw material container included in a vaporizer; vaporizing the liquid or sold raw material in the raw material container to produce a raw material gas; exhausting an interior of the raw material container having the liquid or sold raw material; supplying a carrier gas from the carrier gas supply source to the raw material container; and flowing the raw material gas and the carrier gas from the raw material container to a processing chamber in which a substrate to be processed is accommodated via the gas supply line.

According to another embodiment of the present disclosure, provided is a method of controlling a gas supply apparatus including a vaporizer, a carrier gas supply source and a gas supply line, the method including: supplying a liquid or sold raw material to a raw material container included in a vaporizer; vaporizing the liquid or sold raw material in the raw material container to produce a raw material gas; supplying a carrier gas from the carrier gas supply source to the raw material container; repeatedly supplying the raw material gas and the carrier gas from the raw material container to a processing chamber in which a substrate to be processed to form a thin film is accommodated via the gas supply line; and exhausting an interior of the raw material container having the raw liquid or sold material for each supply of the raw material gas to the processing chamber.

According to still another embodiment of the present disclosure, provided is a method of controlling a gas supply apparatus including a vaporizer, a carrier gas supply source and a gas supply line, the method including: supplying a liquid or sold raw material to a raw material container included in a vaporizer; vaporizing the liquid or sold raw material in the raw material container to produce a raw material gas; supplying a carrier gas from the carrier gas supply source to the raw material container; exhausting an interior of the raw material container during a period of time between a process termination of a current substrate to be processed and a process initiation of a subsequent substrate to be processed; repeatedly supplying the raw material gas and the carrier gas from the raw material container to a processing chamber in which a substrate to be processed to form a thin film is accommodated via the gas supply line;

and exhausting the interior of the raw material container for each supply of the raw material gas.

According to yet another embodiment of the present disclosure, provided is a substrate processing system including: a gas supply apparatus which includes: a vaporizer provided with a raw material container having a liquid or solid raw material received therein and configured to produce a raw material gas by vaporizing the raw material inside the raw material container, a carrier gas supply source configured to supply a carrier gas into the raw material container, and a gas supply line provided between the raw material container and a processing chamber in which a substrate to be processed is accommodated, and configured to flow the raw material gas therethrough together with the carrier gas, a substrate processing apparatus connected to the gas supply apparatus through the gas supply line and including the processing chamber configured to perform a substrate process on the substrate to be processed, and an exhaust unit connected to the processing chamber and the gas supply line through a gas exhaust line; and a control device configured to control the gas supply apparatus and the substrate processing apparatus to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view illustrating a temporal change in internal pressure in the raw material container in the first reference example.

FIG. 13 is a flowchart schematically showing a gas supply apparatus control method according to a third embodiment of the present disclosure.

FIG. 14A is a view showing an operation state of each valve in operation S14 of FIG. 13.

FIG. 14B is a view showing an operation state of each valve in operation S10 of FIG. 13.

FIG. 15A is a view showing an operation state of each valve in operation S1$a$ of FIG. 13

FIG. 15D is a view showing an operation state of each valve in operation S12 of FIG. 13.

DETAILED DESCRIPTION

Figure 1:
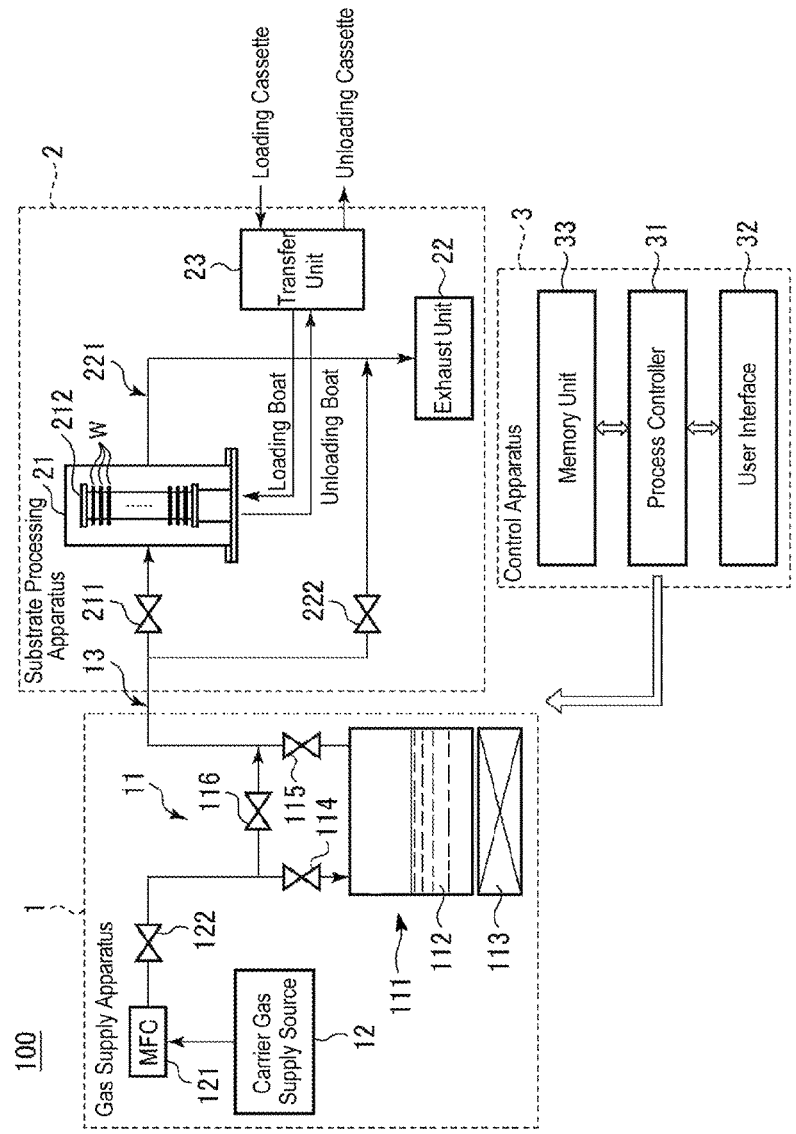
FIG. 1 is a block diagram schematically showing an example of a substrate processing system provided with a gas supply apparatus according to first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the drawings, like reference numerals denote like elements.

First Embodiment

<Substrate Processing System>

FIG. 1 is a block diagram schematically showing an example of a substrate processing system according to a first embodiment of the present disclosure, which is provided with a gas supply apparatus and is capable of performing a gas supply apparatus control method (which will be described later).

As shown in FIG. 1, a substrate processing system 100 according to the first embodiment includes a gas supply apparatus 1, a substrate processing apparatus 2, and a control apparatus 3 configured to control the gas supply apparatus 1 and the substrate processing apparatus 2.

The gas supply apparatus 1 includes a vaporizer 11 and a carrier gas supply source 12. The vaporizer 11 is provided with a raw material container 111 having a raw material 112 received therein, and a heating device 113 configured to heat the raw material 112 received in the raw material container 111. When the substrate processing system 100 is, e.g., a film forming apparatus for forming a thin film on a substrate to be processed, the raw material 112 which is used to form the thin film is received in the raw material container 111 in a liquid or solid state. When the raw material 112 is liquid, the raw material 112 may be obtained by dissolving a substance as a solid, liquid or gas raw material in a solvent. The raw material container 111 is connected to an inlet valve 114 and an outlet valve 115. In addition, a bypass valve 116, which is configured to allow a carrier gas to bypass the raw material container 111, is installed between a gas inlet portion of the inlet valve 114 and a gas outlet portion of the outlet valve 115.

The heating device 113 is configured to heat and vaporize the raw material 112 received in the raw material container 111. Thus, a raw material gas is produced inside the raw material container 111.

The carrier gas supply source 12 is configured to supply the carrier gas into the raw material container 111. An inert gas that is inactive with respect to the raw material gas or the like is used as the carrier gas. Examples of the inert gas may include a nitrogen ($N_2$) gas, and a chemical element of VIIIA group (noble gas) or the like. Further, as the chemical element of the VIIIA group, one selected from a group consisting of helium (He), neon (Ne), argon (Ar), krypton (Kr)s and xenon (Xe) gases may be used. In this embodiment, the argon (Ar) gas is used.

The carrier gas is supplied into the raw material container 111 through a mass flow controller 121 and an opening/closing valve 122. The opening/closing valve 122 is connected to both the gas inlet portion of the inlet valve 114 connected to the raw material container 111 and a gas inlet portion of the bypass valve 116. When the inlet valve 114 is opened and the bypass valve 116 is closed, the carrier gas is supplied into the raw material container 111. Meanwhile, when the inlet valve 114 is closed and the bypass valve 116 is opened, the carrier gas is flown through a gas supply line 13 while bypassing the raw material container 111.

In a state where the carrier gas is supplied into the raw material container 111, when the outlet valve 115 connected to the raw material container 111 is opened, the raw material gas produced inside the raw material container 111 is discharged due to a pressure produced by the carrier gas so that the raw material gas is flown through the gas supply line 13 together with the carrier gas (see a symbol "G" indicated in FIGS. 4A to 4D). The gas supply line 13 is a gas pipe connecting the gas supply apparatus 1 and the substrate processing apparatus 2.

The substrate processing apparatus 2 includes a processing chamber 21, an exhaust unit 22 and a transfer unit 23. A plurality of substrates to be processed W is received in the processing chamber 21 where they are subjected to a film forming process. An example of the substrate to be processed W includes a semiconductor wafer, e.g., a silicon wafer. The gas supply line 13 is connected to a gas inlet portion of a gas supply valve 211 which is connected to the processing chamber 21. When the gas supply valve 211 is opened, the raw material gas is supplied into the processing chamber 21 together with the carrier gas. The processing chamber 21 is coupled to the exhaust unit 22 through a gas exhaust line 221. With this configuration, the interior of the processing chamber 21 is exhausted by the exhaust unit 22 so that in the course of the film forming process, an internal pressure of the processing chamber 21 can be adjusted to a process pressure, or the raw material gas and the like supplied into the processing chamber 21 can be discharged. The exhaust unit 22 is coupled to the gas supply line 13 through an exhaust valve 222. This allows the interior of the gas supply line 13 to be exhausted by the exhaust unit 22 while maintaining a predetermined pressure in the processing chamber 21.

The transfer unit 23 is configured to load and unload the substrates to be processed W into and out of the processing chamber 21. The substrate processing apparatus 2 in this embodiment is a batch-type vertical substrate processing apparatus. A vertical-type boat 212 of the substrate processing apparatus 2 accommodates the plurality of substrates to be processed W in a vertically stacked state. The boat 212 is loaded into the processing chamber 21. Alternatively, the plurality of substrates to be processed W may be loaded into and unloaded from the substrate processing apparatus 2 while being accommodated in a cassette (not shown). The transfer unit 23 transfers the substrates to be processed W between the cassette and the boat 212.

The control apparatus 3 is configured to control the gas supply apparatus 1 and the substrate processing apparatus 2. The control apparatus 3 includes a process controller 31 equipped with a microprocessor (computer), a user interface 32 and a memory unit 33. The process controller 31 is connected to the user interface 32. The user interface 32 includes a touch panel through which an operator performs a command input operation or other operations to manage the gas supply apparatus 1 and the substrate processing apparatus 2, a display configured to visually display an operation status for each of the gas supply apparatus 1 and the substrate processing apparatus 2, and so forth. In addition, the process controller 31 is connected to the memory unit 33. The memory unit 33 stores a control program for performing various processes carried out in the gas supply apparatus 1 and the substrate processing apparatus 2 under the control of the process controller 31, or programs (i.e., recipes) for causing respective components of the gas supply apparatus 1 and the substrate processing apparatus 2 to execute processes pursuant to processing conditions. The recipes are stored in, e.g., a storage medium of the memory unit 33. The storage medium may be a hard disk or a semiconductor memory. Further, the storage medium may be a portable memory such as a CD-ROM, DVD, flash memory or the like. Alternatively, the recipes may be appropriately transmitted from other devices through, e.g., a dedicated line. If necessary, the recipes are read from the memory unit 33 in response to a command received from the user interface 32, and the process controller 31 executes a process according to the read recipes. Thus, the gas supply apparatus 1 and the substrate processing apparatus 2 perform a desired process under the control of the process controller 31.

Second Embodiment

Next, a gas supply apparatus control method according to a second embodiment of the present disclosure will be described. The method is performed using the substrate processing system 100 equipped with the gas supply apparatus 1 (FIG. 1) according to the first embodiment.

First Reference Example

Prior to describing the second embodiment of the present disclosure, a first reference example will be described. Further, it should be noted that the first reference example constitutes a portion of the gas supply apparatus control method according to the second embodiment.

Figure 2:
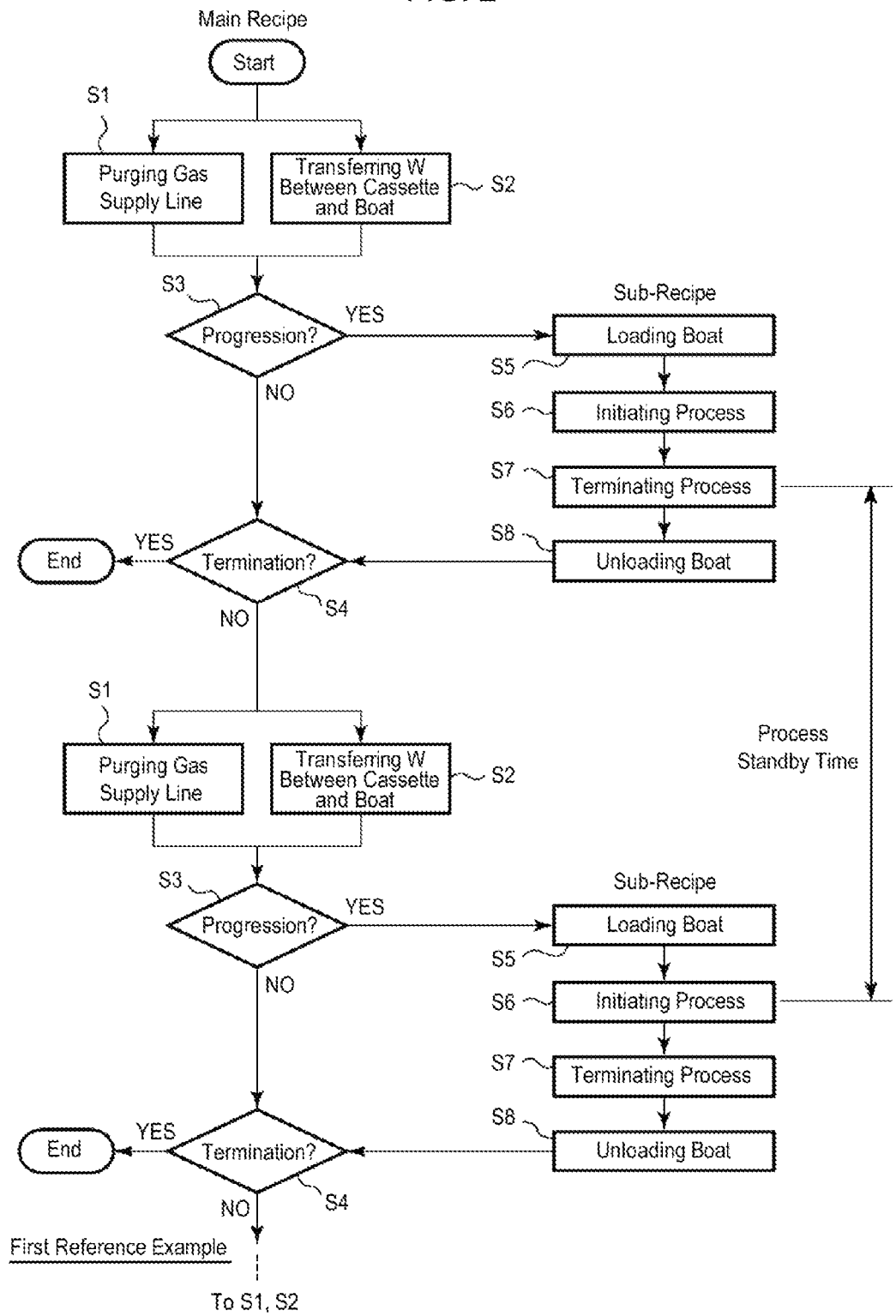
FIG. 2 is a flowchart schematically showing a substrate process according to a first reference example.

FIG. 2 is a flowchart schematically illustrating a substrate process in the first reference example.

As shown in FIG. 2, in the first reference example, the substrate process is performed according to a main recipe and a sub-recipe. The main recipe is to control transferring the substrates to be processed W between the cassette and the vertical-type boat 212, and to determine whether or not a process of the substrates to be processed W (hereinafter, simply referred to as a "substrate process") is progressed, and the like. The sub-recipe is to control the substrate process using the substrate processing apparatus 2 if it is determined in the main recipe that the substrate process is progressed.

First, a purge operation of the gas supply line 13 is performed (operation S1) and the transfer of the substrates to be processed W between the cassette and the vertical-type boat 212 is performed (operation S2). Subsequently, it is determined in operation S3 whether or not the substrate process is progressed. In operation S3, if the result of the determination is YES, operation S5 where the sub-recipe is initiated is performed. Meanwhile, if the result of the determination is NO, operation S4, in which it is determined whether or not the substrate process is terminated, is performed. In operation S4, if the result of the determination is YES, the substrate process is ended.

In the sub-recipe, first, the vertical-type boat 212 holding the substrates to be processed W is loaded into the processing chamber 21 (operation S5). Upon completion of the load operation, the substrate process according to the sub-recipe is initiated (operation S6). Thereafter, if the substrate process is terminated (operation S7), the vertical-type boat 212 holding the processed substrates W is unloaded from the processing chamber 21 (operation S8). Upon completion of the unload operation, the control returns to operation S4 (the main recipe).

In operation S4, it is determined whether or not the substrate process is terminated. If the result of the determination is YES, the substrate process is ended. If the result of the determination is NO, the process returns to operations S1 and S2 where the aforementioned operations S1 to S8 are repeated.

Figure 3:
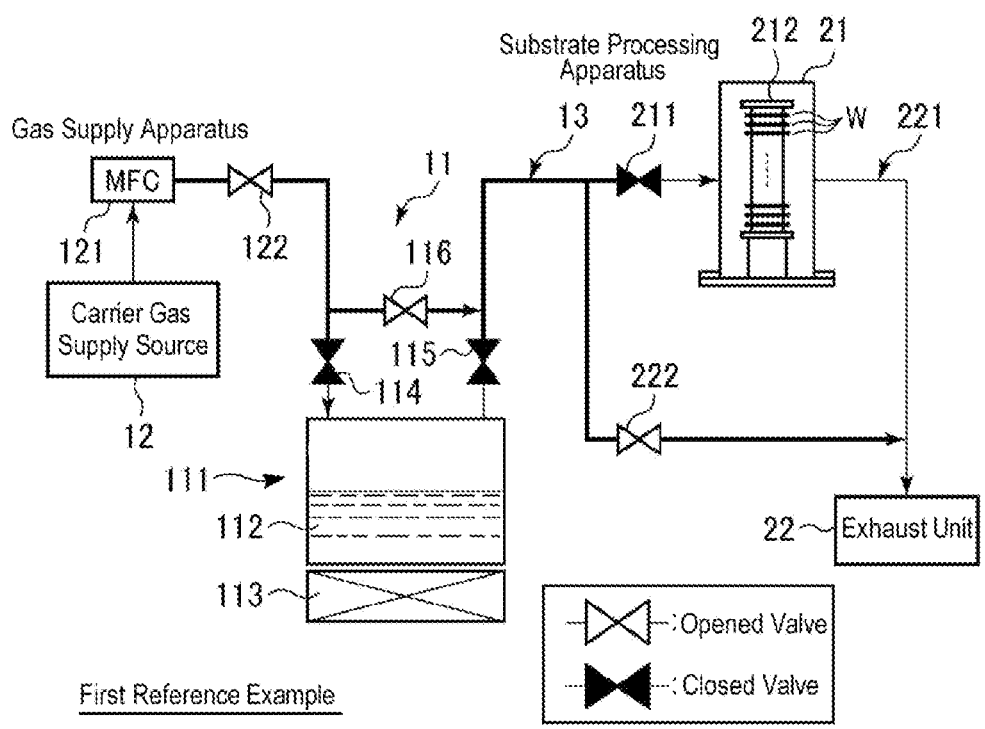
FIG. 3 is a view showing an operation state of each valve when a gas supply line is purged in the first reference example.

In a case where the substrate process continues to be progressed, a period of time between the first termination of the substrate process (i.e., operation S7) and the second initiation of the substrate process (i.e., operation S6) is hereinafter referred to as a process standby time. During the process standby time, the load and unload operations of the vertical-type boat 212 into and from the processing chamber 21, and the transfer of the substrates to be processed W between the cassette and the vertical-type boat 212, are performed. This results in a prolonged period of time in the substrate process. To shorten the prolonged period of time, the gas supply line 13 is subjected to a purge treatment in operation S1. FIG. 3 shows an operation state of each valve when the gas supply line 13 is subjected to the purge treatment.

As shown in FIG. 3, in order to purge the gas supply line 13, the inlet valve 114 and the outlet valve 115 connected to the raw material container 111 and the gas supply valve 211 connected to the processing chamber 21 are closed, and the opening/closing valve 122 coupled to the carrier gas supply source 12, the bypass valve 116 disposed in a side of the raw material container 111, and the exhaust valve 222 connected to the gas supply line 13, are opened. The carrier gas that is supplied to the gas supply line 13 through the opening/closing valve 122 and the bypass valve 116, is exhausted through the exhaust valve 222 toward the exhaust unit 22. Thus, the purge treatment of the gas supply line 13 is performed.

FIGS. 4A to 4D show internal states of the raw material container 111 during the process standby time, respectively.

Figure 4A:
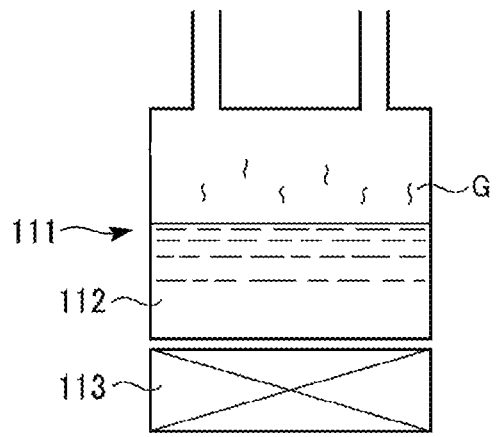
FIGS. 4A to 4D are views showing an internal state of a raw material container in the first reference example.
Figure 4B:
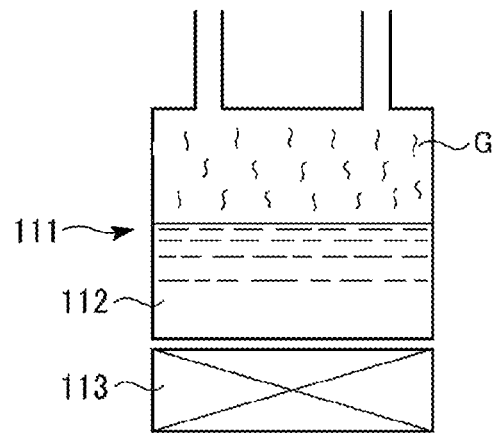

FIG. 4A shows an internal state of the raw material container 111 at a time when the substrate process according to the sub-recipe is terminated (operation S7: the first termination). As shown in FIG. 4A, a small amount of the raw material gas G is presented in the raw material container 111 immediately after the substrate process is terminated (the first termination). During the process standby time, the heating device 113 continues to heat the raw material container 111 for a subsequent process even when operation S7 is ended. This continued heating of the raw material container 111 allows the raw material 112 to vaporize, and thus, to increase (or recover) the amount of the raw material gas G as shown in FIG. 4B. The internal pressure of the raw material container 111 increases as the amount of the raw material gas G increases. This is because both the inlet valve 114 and the outlet valve 115 connected to the raw material container 111 are closed and the interior of the raw material container 111 is sealed. FIG. 5 shows a temporal change in the internal pressure of the raw material container 111.

Figure 4C:
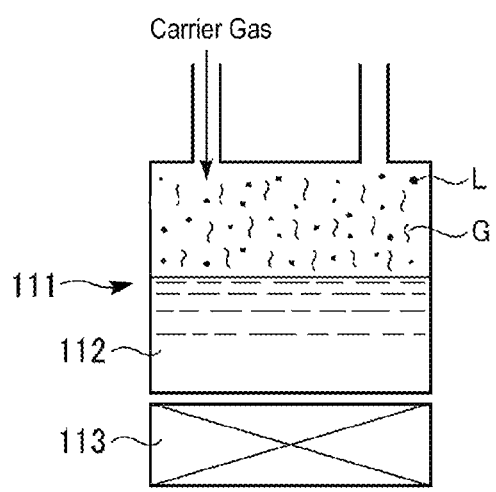
Figure 4D:
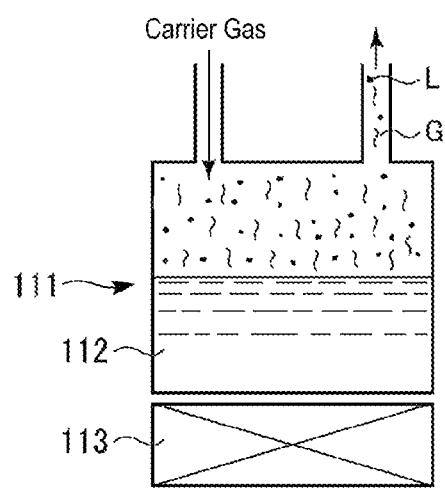

When a subsequent operation S6 is initiated, the inlet valve 114 connected to the raw material container 111 is opened. Then, as shown in FIG. 4C, the carrier gas is supplied into the raw material container 111 via the opened inlet valve 114. As shown in FIG. 5, the supply of the carrier gas into the raw material container 111 rapidly increases the internal pressure of the raw material container 111. Assuming that a flow rate of the carrier gas is increased in order to optimize the supply amount of the raw material gas G for each process. The rapid increase in the internal pressure of the raw material container 111 is in proportion to an increase in the flow rate of the carrier gas.

The increase in the internal pressure of the raw material container 111 causes a phenomenon that the vaporized raw material returns to the liquid state. This phenomenon is called a "fogging" of the raw material gas G. The "fogging" of the raw material gas G occurs when the internal pressure of the raw material container 111 exceeds a "fogging pressure," at which the vaporized raw material returns to the liquid state (or is fogged). After the initiation of the substrate process, the outlet valve 115 connected to the raw material container 111 is also opened. At this time, the rapidly increased internal pressure of the raw material container 111 is gradually decreased. As such, in an early stage of the initiation of the substrate process, as shown in a diagonally hatched portion of FIG. 5 and in FIG. 4D, the raw material gas G having fogged raw materials L mixed therein, is supplied into the processing chamber 21. The fogged raw materials L mixed in the raw material gas G are attached to an inner wall of the processing chamber 21, a surface of the vertical-type boat 212 or the like, an inner wall of the gas supply line 13, or the interior of the gas supply valve 211, which results in a particle generating source.

<Gas Supply Apparatus Control Method>

Figure 6:
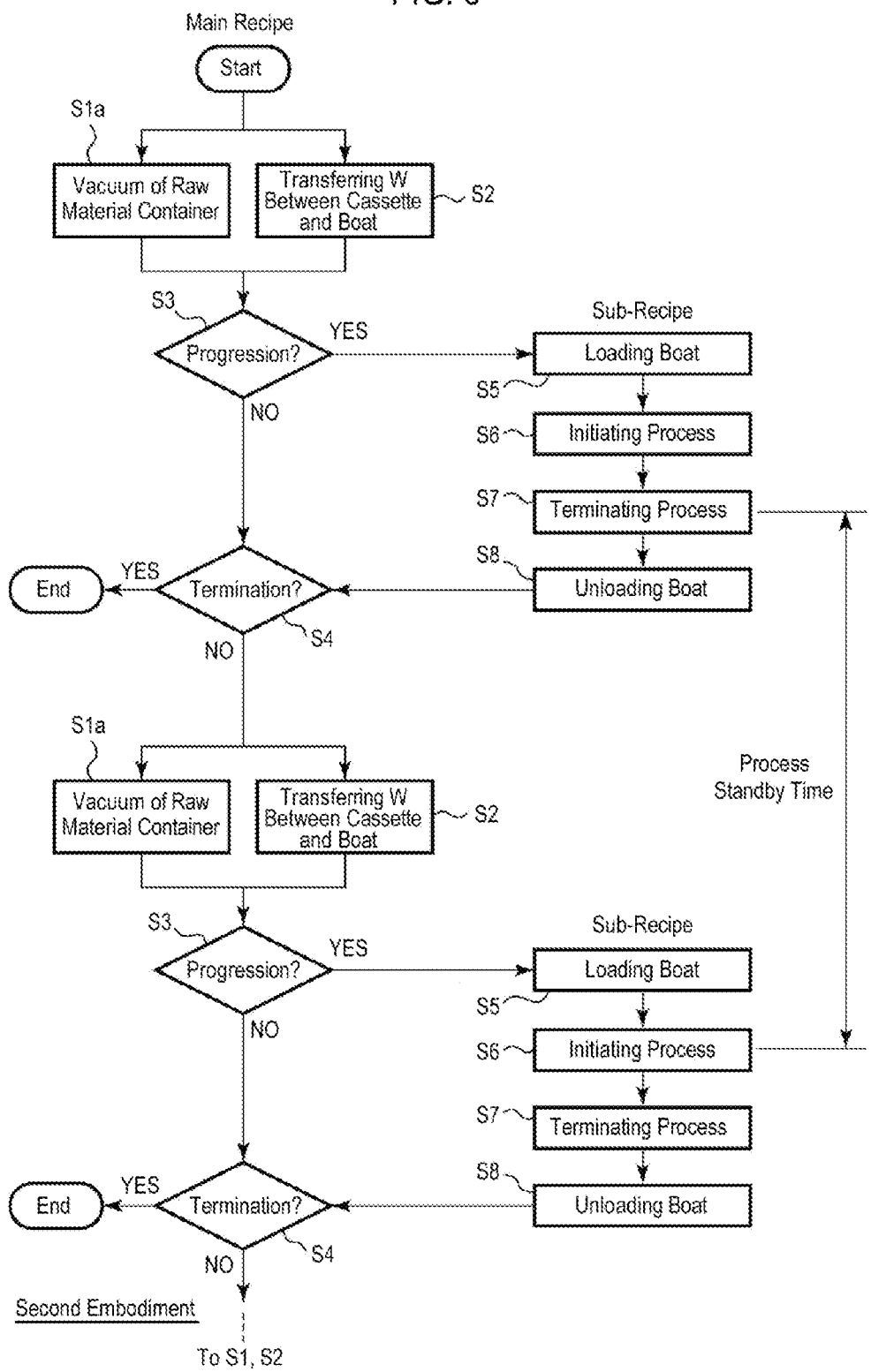
FIG. 6 is a flowchart showing an example of a gas supply apparatus control method according to a second embodiment of the present disclosure.

FIG. 6 is a flowchart illustrating an example of the gas supply apparatus control method according to the second embodiment of the present disclosure.

Figure 7:
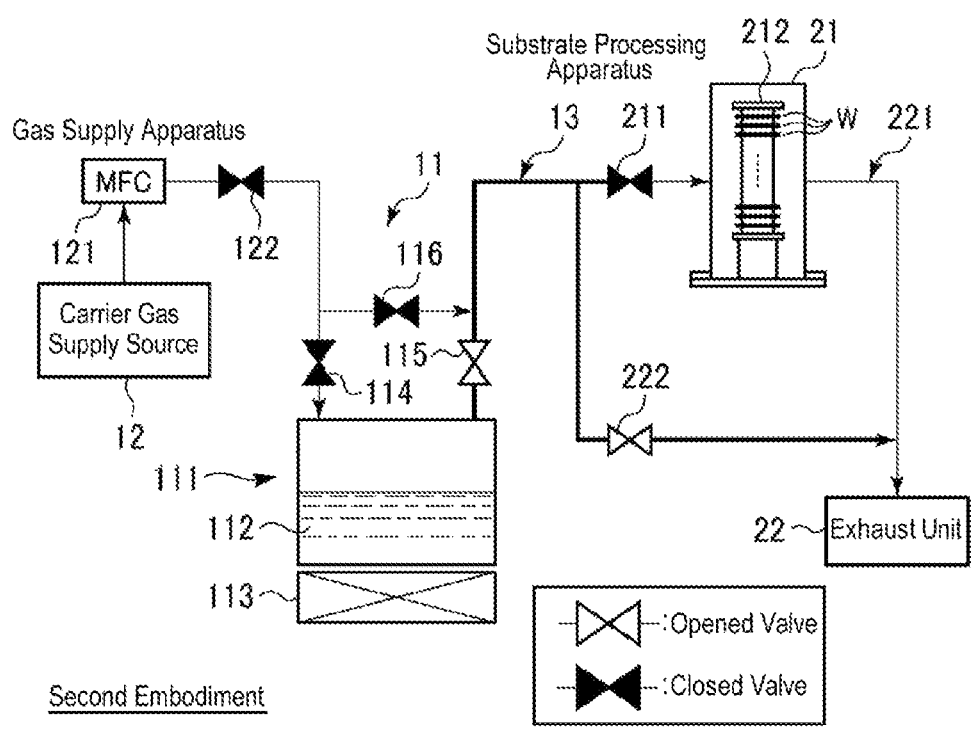
FIG. 7 is a view showing an operation state of each valve when the interior of a raw material container is exhausted in the gas supply apparatus control method according to the second embodiment of the present disclosure.

The gas supply apparatus control method according to the second embodiment is similar to the first reference example previously described except that the interior of the raw material container 111 is exhausted (or vacuumed) (which is represented as "vacuum of raw material container" in operation S1a of FIG. 6) instead of operation S1 where the gas supply line 13 is purged (the first reference example), thus preventing the "fogging" of the raw material gas G. FIG. 7 shows an operation state of each valve when the interior of the raw material container 111 is exhausted (or vacuumed).

As shown in FIG. 7, the outlet valve 115 connected to the raw material container 111 and the exhaust valve 222 disposed in the gas supply line 13 are opened to exhaust the interior of the raw material container 111. At this time, the opening/closing valve 122, the inlet valve 114, the bypass valve 116 and the gas supply valve 211 are closed. With this configuration, the interior of the raw material container 111 is exhausted by the exhaust unit 22 through the gas supply line 13.

Figure 8A:
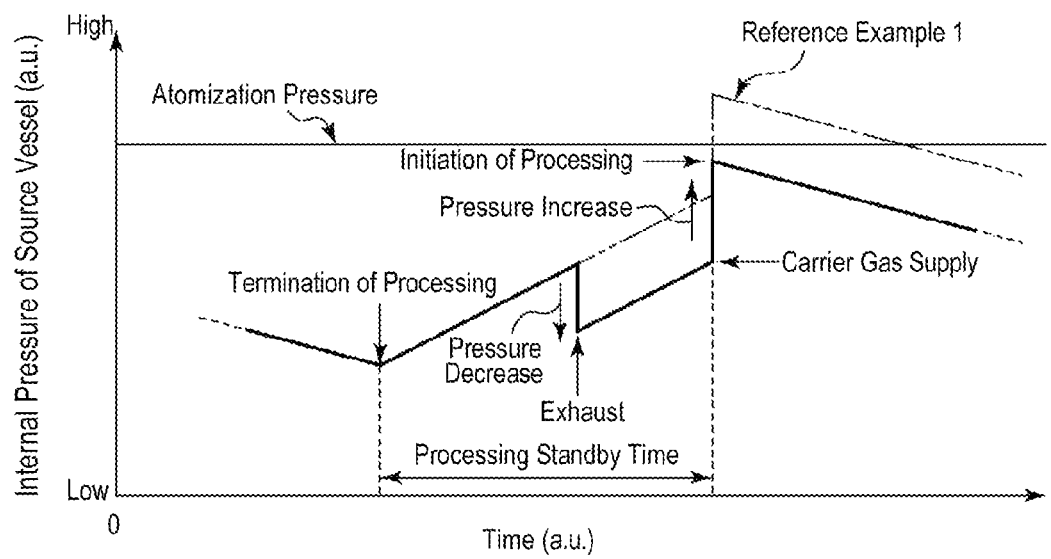
FIG. 8A is a view illustrating a temporal change in internal pressure in the raw material container in the gas supply apparatus control method according to the second embodiment of the present disclosure.

FIG. 8A is a view showing a temporal change in the internal pressure of the raw material container 111 in the gas supply apparatus control method according to the second embodiment of the present disclosure.

As shown in FIG. 8A, the internal pressure of the raw material container 111 becomes the lowest at an instant of time when the substrate process is terminated. Thereafter, during the process standby time, the heating device 113 continues to heat the raw material container 111. As such, the raw material begins to be vaporized within the raw material container 111 so that the internal pressure of the raw material container 111 is gradually increased. In the second embodiment, the interior of the raw material container 111 is exhausted during the process standby time. As a result, the internal pressure of the raw material container 111 is decreased as indicated by a downward-oriented arrow in FIG. 8A. The decreased pressure is set to be less than the "fogging pressure" at an instant of time when a subsequent substrate process is initiated even when the internal pressure of the raw material container 111 is increased by the supply of the carrier gas.

As described above, in the second embodiment, the interior of the raw material container 111 is exhausted before the subsequent substrate process is performed so that the internal pressure of the raw material container 111 is less than the fogging pressure even when the carrier gas is supplied into the raw material container 111. This prevents the raw material gas G from being fogged even when a large amount of the carrier gas is supplied into the raw material container 111.

Therefore, according to the gas supply apparatus control method of the second embodiment which is capable of preventing the "fogging" of the raw material gas G, it is possible to prevent particles from being generated even when the flow rate of the carrier gas supplied into the vaporizer 11 is increased, in the gas supply apparatus 1 which vaporizes the liquid or solid raw materials inside the vaporizer 11 to produce the raw material gas G.

<Modified Example of Gas Supply Apparatus Control Method>

Figure 8B:
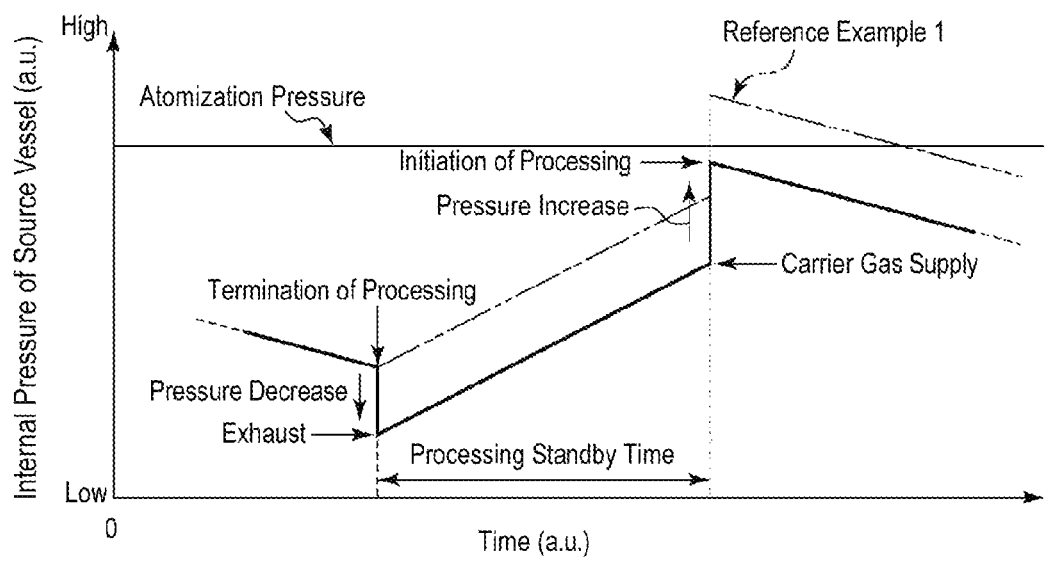
FIG. 8B is a view illustrating a temporal change in internal pressure in the raw material container in a modified example of the gas supply apparatus control method according to the second embodiment of the present disclosure.

FIG. 8B is a view showing a temporal change in internal pressure of the raw material container 111 in a modified example of the gas supply apparatus control method according to the second embodiment of the present disclosure.

As shown in FIG. 8B, the modified example is different from the second embodiment (FIG. 8A) in that the interior of the raw material container 111 is exhausted at an instant of time when the current substrate process is terminated. Even with this configuration, it is possible to provide the same effects as the above example of the gas supply apparatus control method according to the second embodiment.

In other words, the interior of the raw material container 111 is exhausted before the raw material gas G is transferred to the gas supply line 13 together with the carrier gas, i.e., before the carrier gas is supplied into the raw material container 111, as described in the above example of the second embodiment and the modified example.

Second Reference Example

Prior to describing a third embodiment, a second reference example will be described. The third embodiment relates to a method of forming a thin film on a substrate to be processed W, such as an ALD method or an intermittent supply CVD method, in which a cycle including supplying the raw material gas G (in a gas flow operation), exhausting (or vacuuming) the gas supply line 13 and purging the gas supply line 13 is repeated a plural number of times to laminate atom-level layers on the substrate to be processed one by one. Further, it should be noted that the second reference example constitutes a portion of the gas supply apparatus control method according to the third embodiment.

FIGS. 9A and 9B and FIGS. 10A and 10B are views showing a relationship between the supply number of the raw material gas G and a gas volume of the raw material gas G in the second reference example, respectively.

Figure 9A:
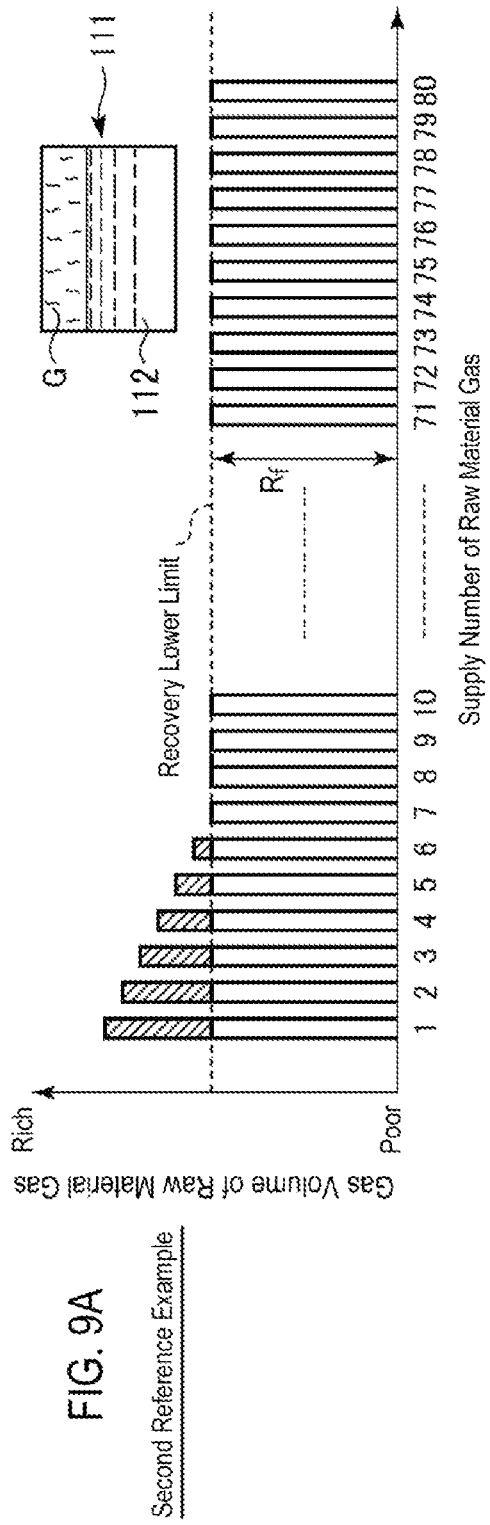
FIGS. 9A and 9B are views illustrating a relationship between the supply number of a raw material gas is supplied and a gas volume of a raw material gas in a second reference example.

FIG. 9A shows a relationship between the supply number of the raw material gas G and the gas volume of the raw material gas G when the supply number of the raw material gas G is 80 cycles or times, for example. The gas volume is defined as a ratio of an amount of the raw material gas G to a vaporization space that is defined inside the raw material container 111.

In an initial supply stage of the raw material gas G, i.e., immediately after the substrate process is initiated, the gas volume of the raw material gas G is in a "rich" state. This is because, as described in the second embodiment, the vaporization of the raw material 112 inside the raw material container 111 progresses during the process standby time. As such, a relatively large amount of the raw material gas G is supplied into the processing chamber 21 during a period of time between a first supply of the raw material gas G and a last supply of the raw material gas G after supplying it several times. After the supply of several times, the gas volume of the raw material gas G is stabilized to a recovery lower limit where the gas volume is recoverable. After the stabilization of the gas volume, the raw material gas G is continuously supplied at the stabilized gas volume.

As shown in FIG. 9A, in a case where the supply number of the raw material gas G is relatively large (e.g., 80 cycles or times), a film having a thick thickness is formed on the substrate to be processed W. Accordingly, in the initial supply stage, even though the raw material gas G is supplied into the processing chamber 21 at a gas volume exceeding the recovery lower limit Rf, a thickness of the thin film has little influence thereon.

Figure 9B:
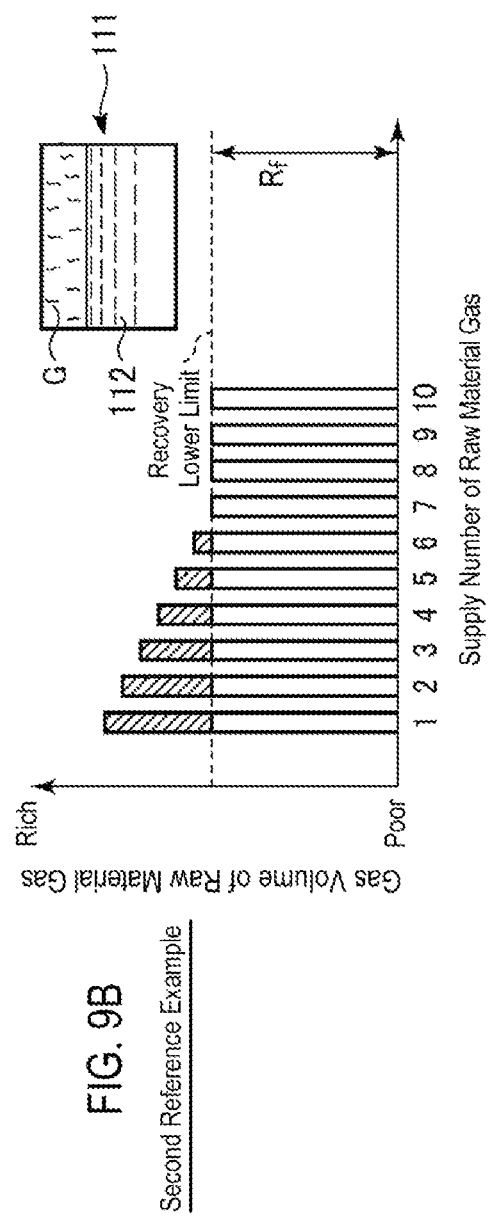

However, in a case where the supply number of the raw material gas G is relatively small (e.g., 10 cycles or times) as shown in FIG. 9B, a film having a thin thickness is formed on the substrate to be processed W. In the initial supply stage, when the raw material gas G is supplied into the processing chamber 21 at a gas volume exceeding the recovery lower limit Rf, a thickness of the thin film is influenced thereon. As an example, if the raw material gas G is supplied into the processing chamber 21 at the gas volume exceeding the recovery lower limit Rf, it is difficult to further reduce the thickness of the thin film.

Figure 10A:
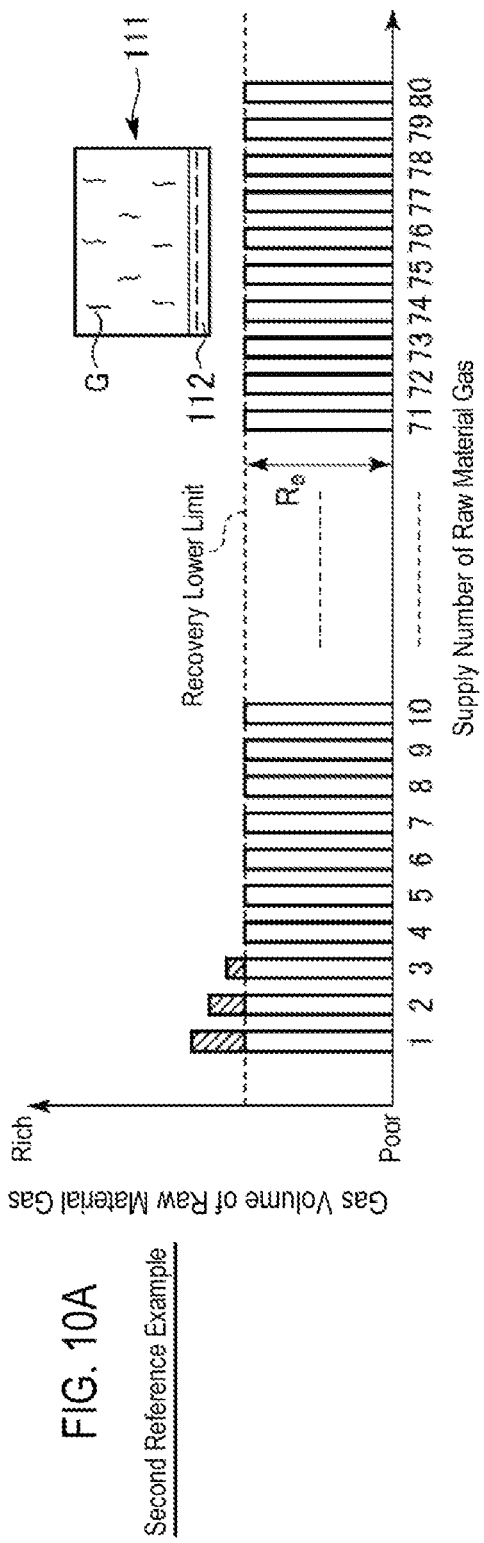
FIGS. 10A and 10B are views illustrating a relationship between the supply number of the raw material gas and the gas volume of the raw material gas in the second reference example.
Figure 10B:
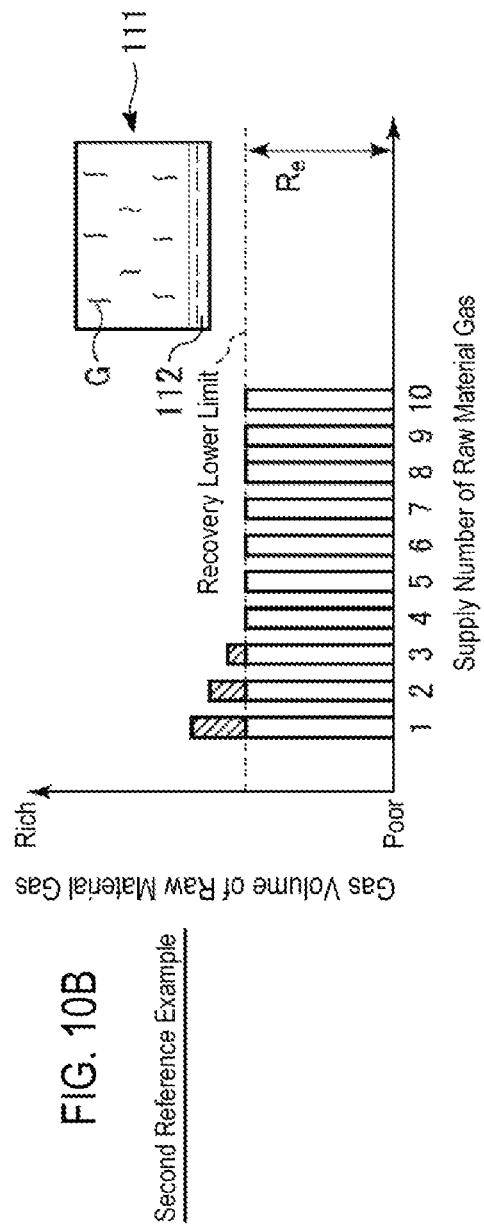

FIGS. 9A and 9B show that the raw material container 111 is almost full with the raw material 112, while FIGS. 10A and 10B show that the raw material container 111 is almost empty, i.e., in a use limit level. As shown in FIGS. 10A and 10B, the gas volume generated in the initial supply stage is poor as compared with when the raw material container 111 is full (FIGS. 9A and 9B). This is because that the vaporization space of the interior of the raw material container 111 increases as the amount of the raw material 112 decreases, and consequently an amount of the vaporized gas produced from the raw material 112 is decreased. In addition, a recovery lower limit Re in the use limit level is smaller than the recovery lower limit Rf when the raw material container 111 is almost full with the raw material 112.

As shown in FIG. 10A, when the supply number of the raw material gas G is, e.g., 80 times, a change in the gas volume or a change in the recovery lower limits Rf and Re, which is generated in the initial supply stage, does not have an influence on a thickness of the thin film to be formed.

However, as shown in FIG. 10B, when the supply number of the raw material gas G is, e.g., 10 times, a change in the gas volume or a change in the recovery lower limits Rf and Re, which is generated in the initial supply stage, has a large influence on the thickness of the thin film to be formed. Specifically, a difference in thickness of the thin film to be formed is drastically varied depending to an amount of the raw material gas G existing inside the raw material container 111. This fails to continuously form a thin film on a substrate to be processed W at a uniform thickness.

The gas supply apparatus control method according to the second embodiment can further reduce a thickness of a thin film to be formed and continuously form a thin film having a uniform thickness in a manner as described below.

Figure 11A:
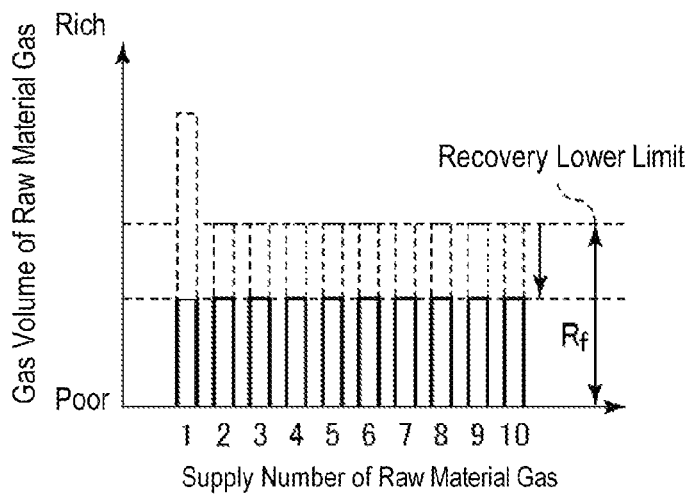
FIGS. 11A to 11C are views illustrating a relationship between a supply number of a raw material gas and a gas volume of the raw material gas in another example of the gas supply apparatus control method according to the second embodiment of the present disclosure.
Figure 11B:
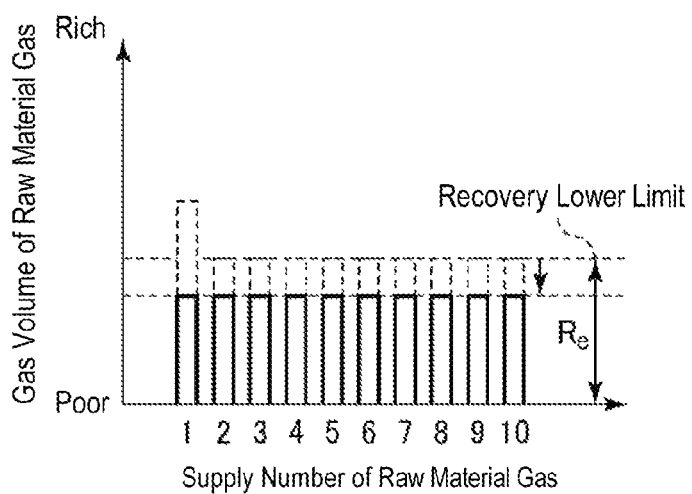
Figure 11C:
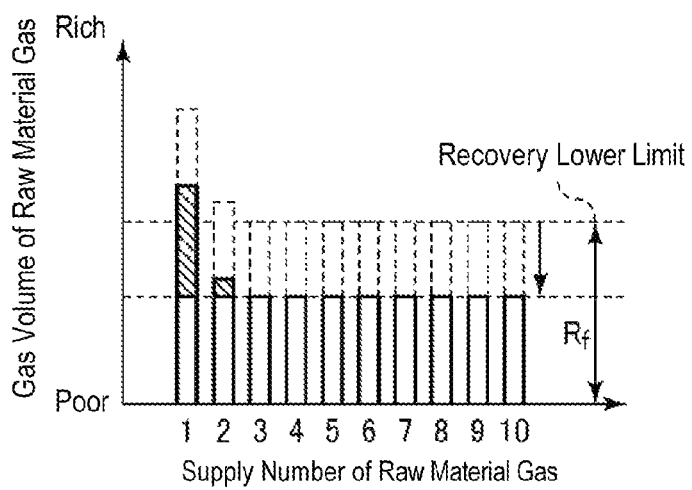

FIGS. 11A to 11C are views showing a relationship between a supply number of a raw material gas and a gas volume of the raw material gas in another example of the gas supply apparatus control method according to the second embodiment of the present disclosure.

As shown in FIGS. 11A and 11B, in the second embodiment, the interior of the raw material container 111 is exhausted before an initial supply of the raw material gas G. This reduces a gas volume of the raw material gas. Such an exhaustion is performed for each supply of the raw material gas G. In addition, the interior of the raw material container 111 is exhausted before an initial supply of the raw material gas G so that the gas volume after the exhaustion is below the recovery lower limit Rf (see FIG. 11A), thus allowing the gas volume to be stabilized within an allowable range for each supply of the raw material gas G. In some embodiments, in a case where the gas volume is varied according to the residual amount of the raw material 112 received in the raw material container 111, the recovery lower limit Re as shown in FIG. 11B may be selected as the use limit level. The exhaustion is performed such that the gas volume is below the recovery lower limit Re.

In the second embodiment, the interior of the raw material container 111 is exhausted for each supply of the raw material gas G. Further, the exhaustion is performed such that the gas volume is below the recovery lower limit Re or the recovery lower limit Rf, which stabilizes the gas volume of the raw material gas G supplied into the processing chamber 21 from the initial supply of the raw material gas G.

Therefore, even when the supply number of the raw material gas G is set to, e.g., 10 times or less in order to form a thin film having a thin thickness, it is possible to prevent a change in the gas volume generated in the initial supply stage or a change in the recovery lower limit Rf or Re as described in the second reference example. This makes it possible to continuously form a thin film on the substrate to be processed W while stabilizing a fluctuation in film thickness.

When the interior of the raw material container 111 is exhausted once as shown in FIG. 11C, the gas volume of the raw material gas G may not be stabilized in some cases. However, according to the second embodiment, the gas volume of the raw material gas G can be stabilized by performing the exhaustion operation two or three times. Therefore, as compared with the second reference example without exhausting the interior of the raw material container 111, it is possible to continuously form a thin film on the substrate to be processed W while preventing a fluctuation in film thickness. Thus, according to the second embodiment, it is possible to provide the gas supply apparatus control method which is capable of forming a thin film having a thin thickness on the substrate to be processed W while controlling the fluctuation in film thickness.

Figure 12:
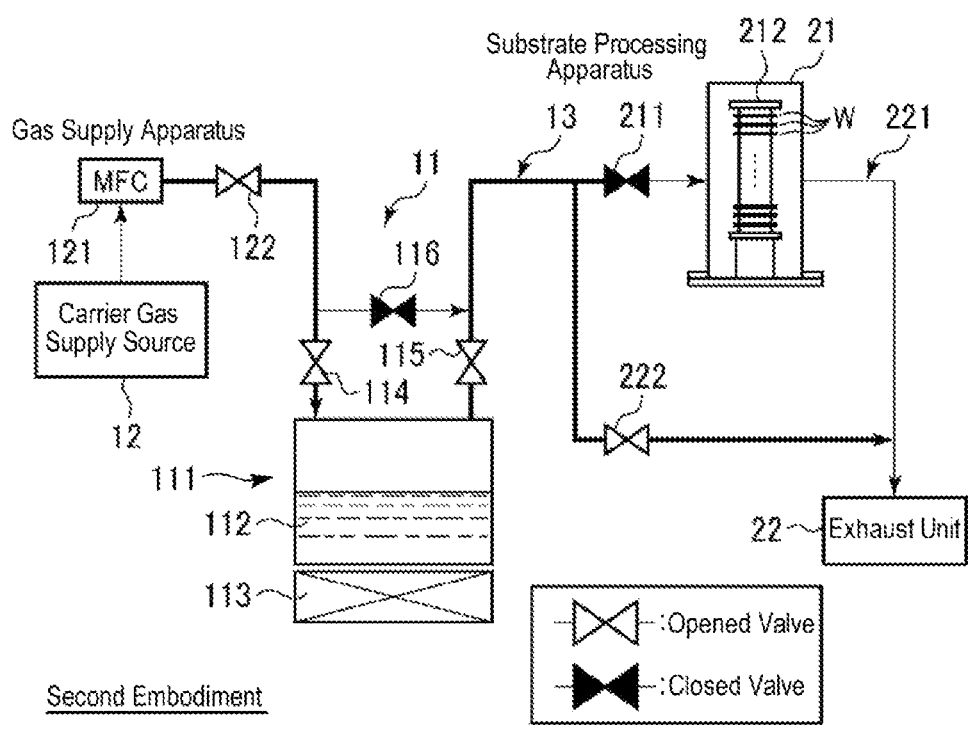
FIG. 12 is a view showing an operation state of each valve when the interior of the raw material container is exhausted in the second embodiment.
Figure 14C:
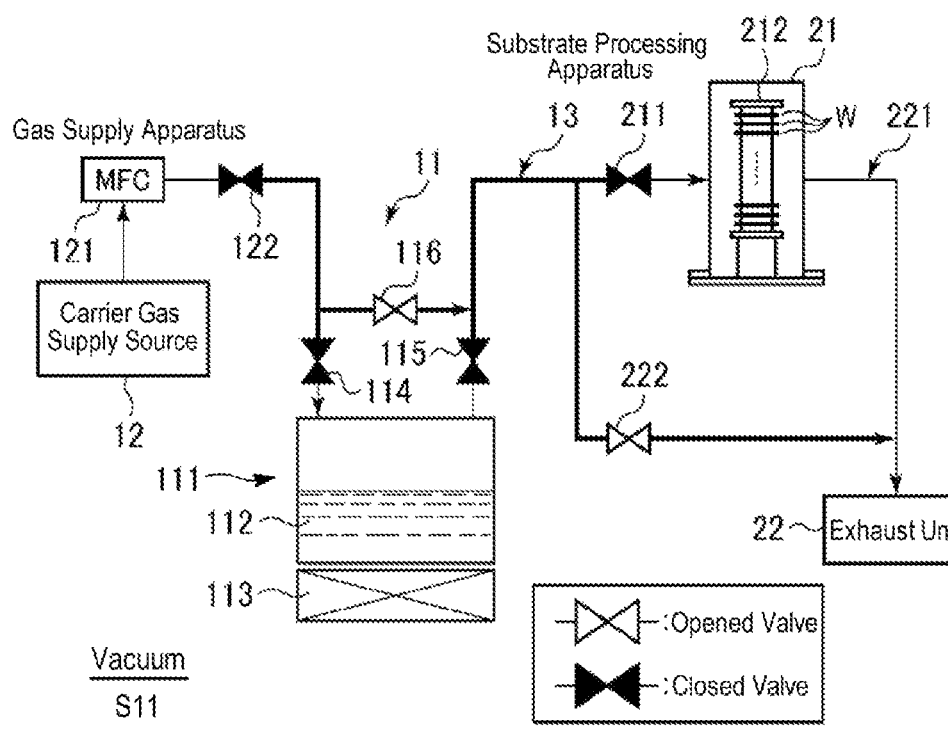
FIG. 14C is a view showing an operation state of each valve in operation S11 of FIG. 13.
Figure 14D:
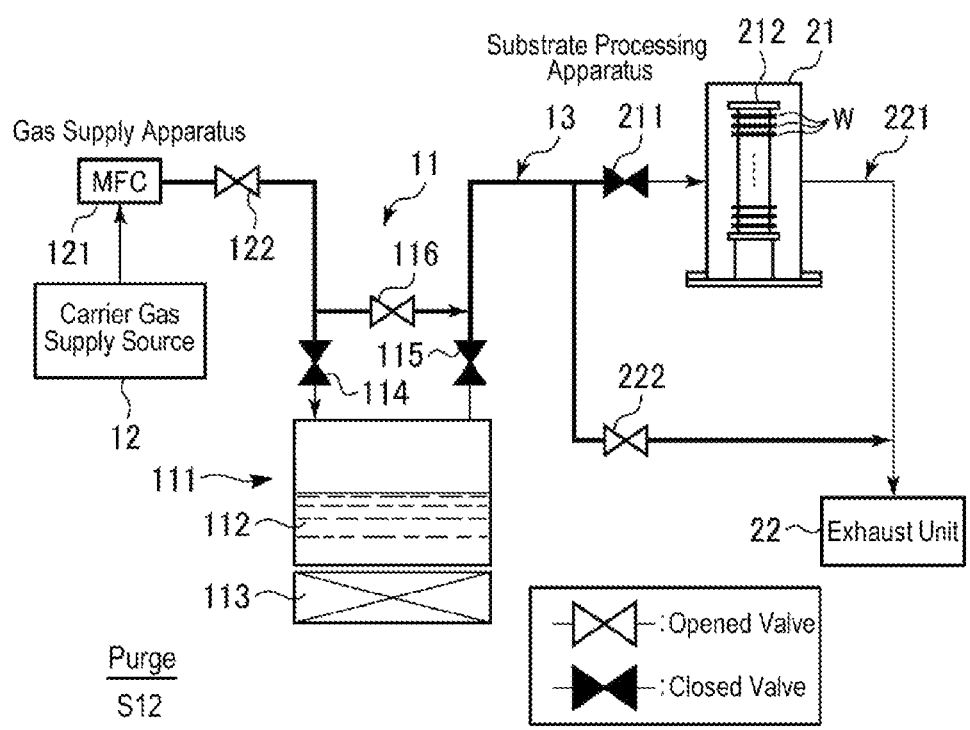
FIG. 14D is a view showing an operation state of each valve in operation S12 of FIG. 13.
Figure 15B:
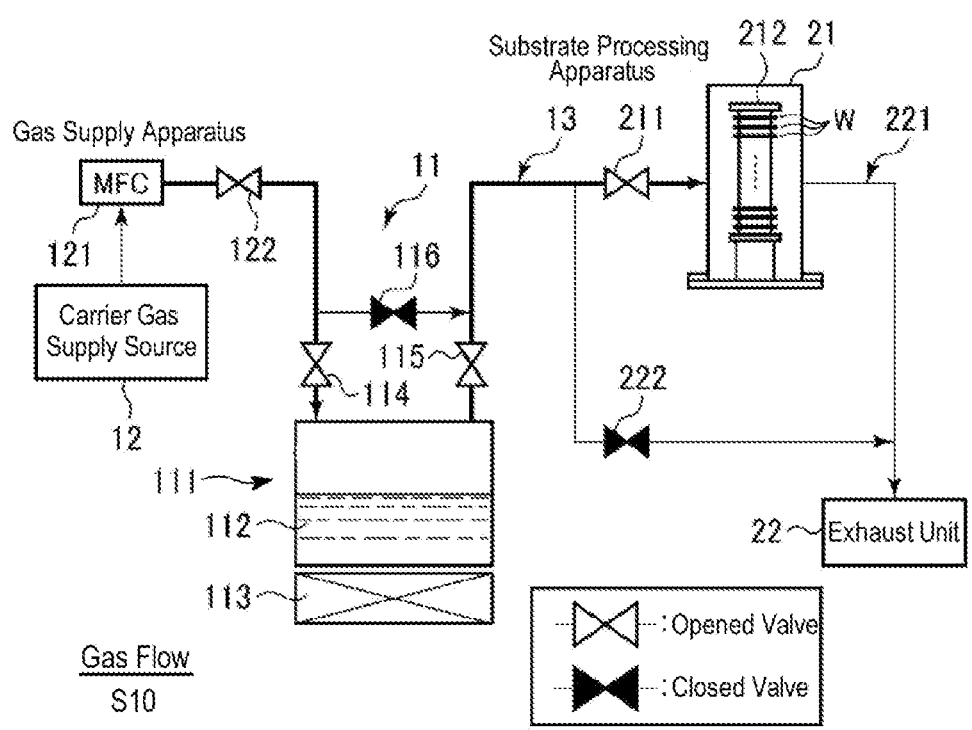
FIG. 15B is a view showing an operation state of each valve in operation S10 of FIG. 13
Figure 15C:
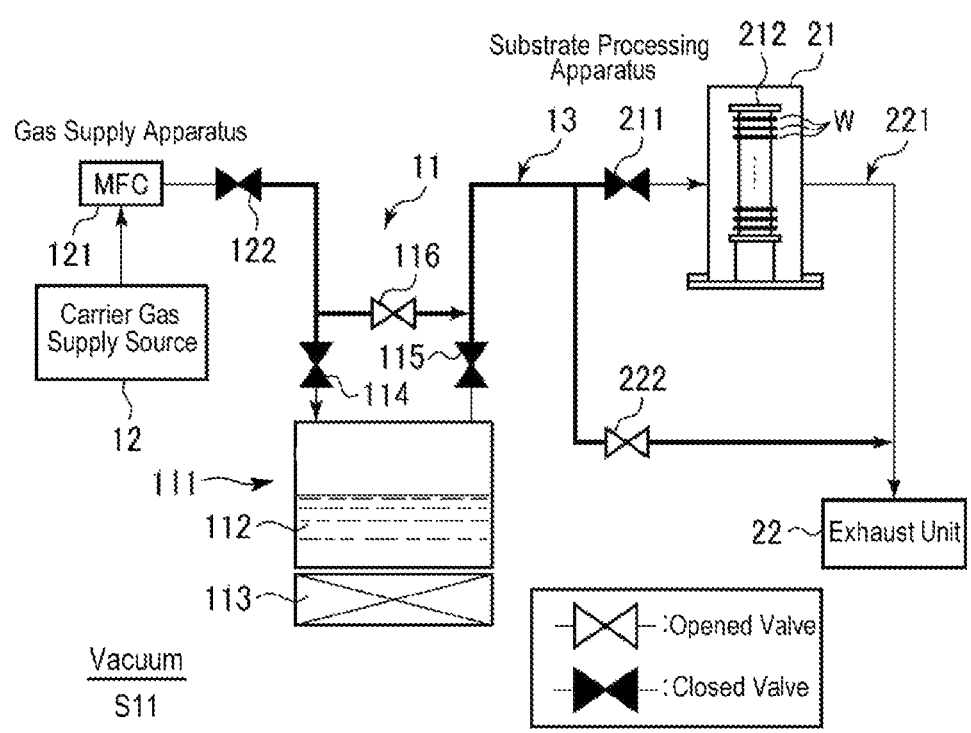
FIG. 15C is a view showing an operation state of each valve in operation S11 of FIG. 13.

FIG. 12 is a view showing a state of each valve when the internal of the raw material container is exhausted in the second embodiment.

As shown in FIG. 12, in the second embodiment, the opening/closing valve 122, the inlet valve 114, the outlet valve 115 and the exhaust valve 222 are opened, and the bypass valve 116 and the gas supply valve 211 are closed such that the interior of the raw material container 111 is exhausted. With this configuration, the interior of the raw material container 111 can be exhausted through the gas supply line 13 by the exhaust unit 22.

Further, in the second embodiment, when exhausting the interior of the raw material container 111, the carrier gas may have been supplied into the raw material container 111. This is because, in the second embodiment, (1) since the gas volume of the raw material gas G inside the raw material container 111 has been reduced, the internal pressure of the raw material container 111 need not be largely decreased as compared with the first embodiment, and (2) if the supply of the carrier gas is repeatedly turned on and off for a short period of time, it may disturb an air current formed in a carrier gas supply line through which the carrier gas supplied from the carrier gas supply source 12 is flown into the raw material container 111. This makes it difficult to stably supply the carrier gas.

Third Embodiment

FIG. 13 is a flowchart schematically showing a gas supply apparatus control method according to a third embodiment.

As shown in FIG. 13, the gas supply apparatus control method according to the third embodiment employs the main recipe according to the second embodiment and is similar to the second embodiment except that the third embodiment includes a sub-recipe in which operations S10 to S14 are further performed. First, in the main recipe, the interior of the raw material container 111 is exhausted as described in the second embodiment (operation S1a), and the substrates to be processed W are transferred between the cassette and the vertical-type boat 212 (operation S2). Subsequently, if it is determined in operation S3 that the substrate process continues to progress, operation S5 where the sub-recipe is initiated is performed.

In operation S5, the vertical-type boat 212 holding the substrates to be processed W is loaded into the processing chamber 21. Upon completion of the load operation, the substrate process is initiated (operation S6). In this embodiment, the raw material gas G is first supplied into the processing chamber 21 (S10: a gas flow operation). Subsequently, the interior of the gas supply line 13 is exhausted (S11: a vacuum operation). Then, the interior of the gas supply line 13 is purged with, e.g., an inert carrier gas (S12: a purge operation). Subsequently, it is determined in operation S13 whether or not the substrate process is terminated. If the result of the determination is NO, the process proceeds to operation S14 where the interior of the raw material container 111 is vacuumed (or exhausted) according to the third embodiment (vacuum of the raw material gas container based on the sub-recipe). Thereafter, a series of operations S10 to S13 are repeated. Meanwhile, if the result of the determination in operation S13 is YES, operation S7 where the substrate process is terminated is performed. Subsequently, in operation S8, the vertical-type boat 212 holding the processed substrates W is unloaded from the processing chamber 21. Upon completion of the unload operation, the process goes to operation S4 where it is determined whether or not the substrate process based on the main recipe is terminated.

If the result of the determination is YES, the substrate process is ended. If the result of the determination is NO, the process returns to operations S1a and S2 from which the aforementioned operations (Operations S1a to S14) are repeated.

As described above, the third embodiment may be implemented together with the second embodiment in combination. FIGS. 14A to 14D show a state of each valve in a series of operations S14, S10, S11 and S12 when implementing the third embodiment, respectively. FIGS. 15A to 15D show a state of each valve in a series of operations S1a, S10, S11 and S12 when implementing the second and third embodiment in combination, respectively.

Although the present disclosure has been described according to the some embodiments, the present disclosure is not limited thereto. A variety of modifications may be made without departing from the spirit of the disclosures.

As an example, while in the above embodiments the liquid has been described to be used as the raw material, a solid may be used as the raw material. Further, in the above embodiments, the batch-type vertical substrate processing apparatus has been described to be used as the substrate processing apparatus, but is not limited thereto. In some embodiments, various types of substrate processing apparatuses may be employed.

According to some embodiments of the present disclosure, it is possible to prevent particles from being increased even if a flow rate of a carrier gas supplied into a vaporizer is increased, in a gas supply apparatus which produces a raw material gas by vaporizing a liquid or solid raw material supplied into the vaporizer.

Further, according to some embodiments of the present disclosure, it is possible to form a thin film having a thin thickness on a substrate to be processed while preventing a fluctuation in film thickness.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a gas supply apparatus including a vaporizer, a carrier gas supply source and a gas supply line, the method comprising:
   supplying a liquid or solid raw material to a raw material container included in a vaporizer;
   vaporizing the liquid or solid raw material in the raw material container to produce a raw material gas;
   without flowing a carrier gas, exhausting directly to vacuum an interior of the raw material container of the raw material gas, which remained from a film formation of a current substrate, while the liquid or solid raw material, which is present in an amount sufficient to perform at least one process cycle, is continuously vaporized within the raw material container, at a pressure before a fogging phenomenon occurs;
   supplying the carrier gas from the carrier gas supply source to the raw material container after the interior of the raw material container is exhausted to vacuum; and
   flowing the raw material gas and the carrier gas from the raw material container to a processing chamber, in which a subsequent substrate to be processed is accommodated via the gas supply line, for a film formation of the subsequent substrate, wherein an internal pressure of the raw material container includes a fogging pressure at which the raw material gas produced by vaporizing the raw material is fogged, and
   wherein exhausting to vacuum the interior of the raw material container is performed such that in a process initiation of the subsequent substrate to be processed, when the carrier gas has been supplied into the raw material container, the internal pressure of the raw material container is below the fogging pressure.

2. The method of claim 1, wherein the vaporizer includes a heating device configured to heat the raw material received in the raw material container, and
   wherein the heating device continues to heat the raw material received in the raw material container during a period of time between a process termination of a current substrate to be processed and a process initiation of the subsequent substrate to be processed.

3. A method of controlling a gas supply apparatus including a vaporizer, a carrier gas supply source and a gas supply line, the method comprising:
   supplying a liquid or solid raw material to a raw material container included in a vaporizer;
   vaporizing the liquid or solid raw material in the raw material container to produce a raw material gas;
   supplying a carrier gas from the carrier gas supply source to the raw material container;
   repeatedly supplying the raw material gas and the carrier gas from the raw material container to a processing chamber in which a substrate to be processed to form a thin film is accommodated via the gas supply line; and
   without flowing the carrier gas, exhausting directly to vacuum an interior of the raw material container of the raw material gas, which remained from a film formation of a current substrate, while the liquid or solid raw material, which is present in an amount sufficient to perform at least one process cycle, is continuously vaporized within the raw material container, at a pressure before a fogging phenomenon occurs, for each supply of the raw material gas to the processing chamber, wherein an internal pressure of the raw material container includes a fogging pressure at which the raw material gas produced by vaporizing the raw material is fogged, and wherein exhausting to vacuum the interior of the raw material container is performed such that in a process initiation of the subsequent substrate to be processed, when the carrier gas has been supplied into the raw material container, the internal pressure of the raw material container is below the fogging pressure.

4. The method of claim 3, wherein exhausting to vacuum the interior of the raw material container is performed such that a gas volume of the raw material gas supplied from the raw material container is maintained within an allowable range for each supply of the raw material gas.

5. The method of claim 4, wherein the gas volume of the raw material gas includes a recovery lower limit, which is a limit of the gas volume of the raw material gas in the processing chamber, at which the gas volume of the raw material gas is maintained to provide a predetermined thickness of the thin film during a time interval between current and subsequent flows of the raw material gas from the interior of the raw material container to the gas supply line together with the carrier gas, and where exhausting the interior of the raw material container is performed such that the gas volume is below the recovery lower limit.

6. The method of claim 4, wherein the gas volume of the raw material gas includes a recovery lower limit, wherein when the recovery lower limit varies depending on a residual amount of the raw material received in the raw material container, the recovery lower limit corresponds to a value for a use limit level of the gas volume where the residual amount of the raw material in the processing chamber is close to zero, and wherein exhausting the interior of the raw material container is performed such that the gas volume is below the recovery limit.

7. The method of claim 3, wherein repeatedly supplying the raw material gas is performed 10 times or less.

8. A method of controlling a gas supply apparatus including a vaporizer, a carrier gas supply source and a gas supply line, the method comprising:

supplying a liquid or solid raw material to a raw material container included in a vaporizer;

vaporizing the liquid or solid raw material in the raw material container to produce a raw material gas;

supplying a carrier gas from the carrier gas supply source to the raw material container;

without flowing the carrier gas, exhausting directly to vacuum an interior of the raw material container of the raw material gas, which remained from a film formation of a current substrate, while the liquid or solid raw material, which is present in an amount sufficient to perform at least one process cycle, is continuously vaporized within the raw material container, to prevent a fogging phenomenon, during a period of time between a process termination of the current substrate to be processed and a process initiation of a subsequent substrate to be processed;

repeatedly supplying the raw material gas and the carrier gas from the raw material container to a processing chamber in which a substrate to be processed to form a thin film is accommodated via the gas supply line; and without flowing the carrier gas, exhausting directly to vacuum the interior of the raw material container for each supply of the raw material gas at a pressure before a fogging phenomenon occurs, wherein an internal pressure of the raw material container includes a fogging pressure at which the raw material gas produced by vaporizing the raw material is fogged, and wherein exhausting to vacuum the interior of the raw material container is performed such that in a process initiation of the subsequent substrate to be processed, when the carrier gas has been supplied into the raw material container, the internal pressure of the raw material container is below the fogging pressure.

* * * * *